United States Patent [19]
Takahashi et al.

[11] Patent Number: 5,906,874
[45] Date of Patent: May 25, 1999

[54] OPTICAL RECORDING MEDIUM, AND ITS FABRICATION METHOD

[75] Inventors: Makoto Takahashi; Takashi Kikukawa; Isamu Kuribayashi, all of Nagano; Junji Tominaga, Tsukuba, all of Japan

[73] Assignee: TDK Corporation, Tokyo, Japan

[21] Appl. No.: 08/988,672

[22] Filed: Dec. 11, 1997

[30] Foreign Application Priority Data

Dec. 28, 1996 [JP] Japan .................................... 8-358415

[51] Int. Cl.$^6$ ....................................................... B32B 3/00
[52] U.S. Cl. ...................... 428/64.1; 428/64.4; 428/64.5; 428/64.6; 428/913; 430/270.13; 430/495.1; 430/945; 369/283; 369/288
[58] Field of Search ................................. 428/64.1, 64.2, 428/64.4, 64.5, 64.6, 913; 430/270.13, 495.1, 945; 369/283, 288

[56] References Cited

U.S. PATENT DOCUMENTS 5,709,978 1/1998 Hirotsune et al. ................. 430/270.13
5,818,808 10/1998 Takada et al. ........................... 369/116

FOREIGN PATENT DOCUMENTS 63-103453 5/1988 Japan .
4-114330 4/1992 Japan .

*Primary Examiner*—Elizabeth Evans
*Attorney, Agent, or Firm*—Laubscher & Laubscher; R. J. Lasker

[57] ABSTRACT

The invention provides a phase change type optical recording medium enabling an increased jitter concomitant with repeated overwriting to be restrained or substantially eliminated. In the optical recording medium comprising a phase change type recording layer on a substrate, the recording layer has a lower dielectric layer in contact with a lower side thereof and an upper dielectric layer in contact with an upper side thereof, and at least one of the upper and lower dielectric layers contains zinc sulfide, and further includes a metal element A that has a standard free energy for forming a sulfide thereof lower than a standard free energy for forming ZnS at 0 to 1,000° C. The ratio of metal element A to all metal elements in the zinc sulfide-containing dielectric layer is less than 2 at %. Metal element A is typically Ce, Ca, Mg, Sr, Ba, and Na.

6 Claims, 2 Drawing Sheets

OPTICAL RECORDING MEDIUM, AND ITS FABRICATION METHOD

BACKGROUND OF THE INVENTION

The present invention relates to a phase change type optical recording medium, and its fabrication method.

Highlight is recently focused on optical recording media capable of recording information at a high density and erasing the recorded information for rewriting or overwriting. One typical rewritable optical recording medium is of the phase change type wherein the recording layer is irradiated with laser beam to change its crystallographic state whereupon a change of reflectance by the crystallographic change is detected for reading. Optical recording media of the phase change type are of great interest since they can be overwritten by modulating the intensity of a single light beam and the optical system of the drive unit used for their operation is simpler as compared with magneto-optical recording media.

Most optical recording media of the phase change type use Ge—Te base materials which provide a substantial difference in reflectance between crystalline and amorphous states and have a relatively stable amorphous state. In recent years, it has been proposed to use compounds known as chalcopyrites.

Chalcopyrite compounds are extensively investigated as compound semiconductor materials, and applied to solar batteries and the like. The chalcopyrite compounds are composed of $Ib-IIIb-VIb_2$ or $IIb-IVb-Vb_2$ as expressed in terms of the Groups of the Periodic Table and have two stacked diamond structures. The structure of chalcopyrite compounds can be readily determined by X-ray structural analysis and their basic characteristics are described in Physics, Vol. 8, No. 8 (1987), page 441, Denki Kagaku (Electrochemistry), Vol. 56, No. 4 (1988), page 228, and other literature.

Among the chalcopyrite compounds, $AgInTe_2$ is known to be applicable as a recording material by diluting it with antimony or Sb or bismuth or Bi. The resulting optical recording media are generally operated at a linear velocity of about 7 m/s. See JP-A's 3-240590, 3-99884, 3-82593, 3-73384 and 4-151286.

In addition to these phase change type optical recording media using chalcopyrite compounds, JP-A's 4-267192, 4-232779 and 6-166268 disclose phase change type optical recording media wherein an $AgSbTe_2$ phase forms upon the crystallization of a recording layer.

When information is recorded on a phase change type optical recording medium, the recording layer is irradiated with laser beam of power (recording power) high enough to bring the recording layer to a temperature higher than the melting point thereof. The recording layer is melted at spots with the recording power applied thereon, and then quickly cooled so that recorded marks of amorphous nature can be formed. When the recorded marks are erased, on the other hand, the recording layer is irradiated with laser beam having such a relatively low power (erasing power) as to bring the temperature of the recording layer to a temperature higher than that the crystallization temperature thereof but lower than the melting point thereof. The recorded marks with the erasing power applied thereon go back to the amorphous state because they are slowly cooled down after heated to the temperature higher than their crystallization temperature.

In the phase change type optical recording medium, dielectric layers are formed on both sides of the recording layer. Requirements for these dielectric layers are that:

(1) they can protect the recording layer or substrate against thermal hysteresis due to irradiation with laser beam, (2) they can amplify reading signals making use of the interference effect of light reflected at the interface of each layer, and (3) their thermal conductivity, etc. can be properly regulated to regulate record/erase characteristics.

For a dielectric layer meeting such requirements, a dielectric layer composed mainly of ZnS having a high refractive index is often used. For instance, JP-A 63-103453 discloses an optical information recording medium having a dielectric layer comprising a mixture of ZnS and $SiO_2$. The publication states that among the advantages of the invention there are an increase in the sensitivity to incident light power upon recording, and an increase in the number of repetition of write/read cycles to which the dielectric material is exposed, and goes on that the sensitivity increase is due to the optimization of the heat constant of the dielectric layer, and the increase in the number of repetition of write/read cycles is due to the prevention of denaturation of the dielectric layer. JP-A 4-114330, too, discloses an optical information recording medium having a dielectric layer comprising a mixture of a compound selected from the group consisting of ZnS, etc., and a compound selected from the group consisting of $Ta_2O_5$, etc. The publication alleges that among the advantages of the invention there are excellent humidity resistance, less defects, and no interlaminar separation.

According to experiments conducted by the inventors, however, it has been found that when a ZnS-containing dielectric material is used for the dielectric layers of the phase change type optical medium, repeated overwriting gives rise to some considerable jitters, which in turn bring about a considerable reduction in the number of repetition of write/read cycles. According to TDS analysis of a ZnS—$SiO_2$ dielectric layer, it has also been found that, upon included in the form of a simple substance or dimer in the dielectric layer during its formation, sulfur is isolated and sublimed from the dielectric layer by heating to about 400° C. This temperature is close to the melting point of the recording layer. Thus, the sulfur is diffused from within the dielectric layer into the recording layer upon recording, resulting in a change in the composition of the recording layer. Such actions lead to a decrease in the rate of erasure or fluctuations in the distance between recorded marks, which are believed to be attributable to the increased jitters due to repeated overwriting.

SUMMARY OF THE INVENTION

A primary object of the present invention is to provide a phase change type optical recording medium for reducing or substantially restraining an increased jitter concomitant with repeated overwriting.

Such an object is achieved by the inventions defined below as (1) to (6).

(1) An optical recording medium comprising a phase change type recording layer on a substrate, said recording layer having a lower dielectric layer in contact with a lower side thereof and an upper dielectric layer in contact with an upper side thereof, and at least one of said upper and lower dielectric layers containing zinc sulfide, and further including a metal element A that has a standard free energy for forming a sulfide thereof lower than a standard free energy for forming zinc sulfide at 0 to 1,000° C., provided that a ratio of said metal element A to all metal elements in said zinc sulfide-containing dielectric layer is less than 2 at %.

(2) The optical recording medium of (1), wherein said metal element A is at least one element selected from the group consisting of cerium, calcium, magnesium, strontium, barium, and sodium.

(3) The optical recording medium of (1) or (2), wherein said zinc sulfide-containing dielectric layer contains at least one compound selected from the group consisting of silicon oxide, tantalum oxide, titanium oxide, lanthanum oxide, silicon nitride, aluminum nitride, magnesium fluoride, sodium fluoride, and thorium fluoride.

(4) The optical recording medium of any one of (1) to (3), wherein said zinc sulfide-containing dielectric layer has a zinc sulfide content of 50 to 95 mol %.

(5) The optical recording medium of any one of (1) to (4), wherein the ratio of said metal element A to all metal elements in said zinc sulfide-containing dielectric layer is in a range of 0.01 to 1.5 at %.

(6) A method of fabricating an optical recording medium as defined in any one of (1) to (5), wherein said zinc sulfide-containing dielectric layer is formed by sputtering in an atmosphere comprising a mixture of argon and oxygen.

In the present invention, the zinc sulfide (ZnS)-containing dielectric layer further contains metal element A in which the standard free energy for the formation of a sulfide thereof is lower than the standard free energy for the formation of ZnS. In other words, the ZnS-containing dielectric layer contains metal element A having an affinity for sulfur (S) stronger than an affinity for zinc (Zn). This makes it possible to prevent an isolation of a simple substance or dimer of sulfur included in the dielectric layer at the time of its formation and hence diffusion of the sulfur in the recording layer at the time of recording. It is thus possible to prevent changes in the composition of the recording layer upon repeated overwriting and hence restrain a jitter increase.

Referring again to JP-A 4-114330, $CeO_2$ is disclosed as one of compounds constituting a group comprising $Ta_2O_5$, etc. The publication states that the content of the group comprising $Ta_2O_5$, etc. is 2 to 70 mol %, and $(ZnS)_{80}(Ta_2O_5)_{20}$ is primarily used in the examples given therein. For a specific composition containing $CeO_2$, the publication refers only to a system with $Ta_2O_5$ replaced by $CeO_2$, i.e., $(ZnS)_{80}(CeO_2)_{20}$. Thus, the publication fails to show any specific composition falling within the scope of the present invention; that is, a composition specified therein is one containing $CeO_2$ in an amount larger than intended in the present invention. With such a composition containing a larger amount of $CeO_2$, it is impossible to achieve the effect on prevention of jitters upon repeated overwriting, that is, the effect (advantage or benefit of the present invention). Also, a dielectric layer to which much $CeO_2$ is added is a hard yet stable system, but has a disadvantage of being sensitive to thermal shocks produced by the repetition of overwriting cycles. In this regard, only Ce among the elements herein intended by metal element A is disclosed in JP-A 4-114330.

An upper dielectric layer of a phase change type optical recording medium has usually a reflective layer provided thereon. This reflective layer serves to increase the reflectance of the medium and dissipate heat from the recording layer. To form small recorded marks for high-density recording, it is required to rapidly cool regions with recorded marks formed thereon. As described in JP-A 4-114330, the upper dielectric layer containing much $CeO_2$ is preferred for the formation of small recorded marks because it can be rapidly cooled due to its high thermal conductivity. With the addition of too much $CeO_2$, however, it is impossible to increase C/N because the refractive index of the upper dielectric layer becomes too high to make a reflectance difference between the recorded marks and their surroundings. If the dielectric layer is made thin, it is then possible to increase C/N; however, no sufficient rate of erasure is then obtainable because its cooling occurs too rapidly.

BRIEF DESCRIPTION OF THE DRAWINGS

These and further features of the present invention will be apparent with reference to the following description and drawings, in which.

BEST MODE FOR CARRYING OUT THE INVENTION

Some preferable embodiments of the present invention will now be explained at great length.

Figure 1:
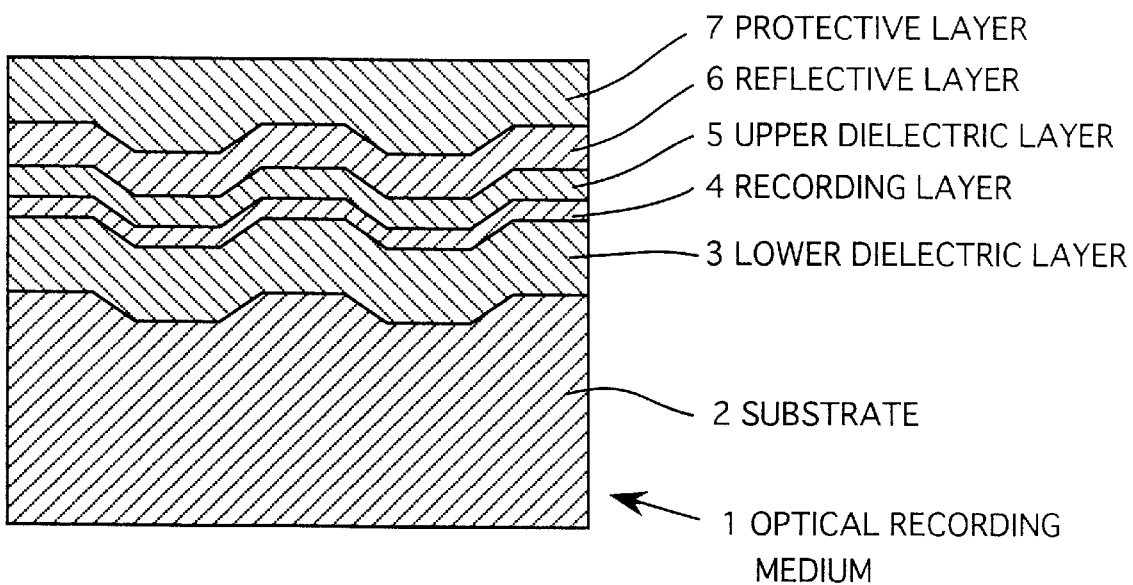
FIG. 1 is a sectional schematic illustrative of a portion of an optical recording medium according to the present invention.

One specific architecture of the optical recording medium according to the present invention is shown in FIG. 1. As shown, an optical recording medium 1 has on a substrate 2 a lower dielectric layer 3, a recording layer 4, an upper dielectric layer 5, a reflective layer 6, and a protective layer 7.

Substrate

In the optical recording medium of this architecture, the recording layer 4 is irradiated through the substrate 2 with a light beam. It is therefore preferable that the substrate 2 is constructed of a material substantially transparent to the light beam used, for instance, a resinous or glass material. For the resin, it is preferable to use acrylic resin, polycarbonate, epoxy resin, polyolefin or the like. The shape and size of the substrate are not critical to the practice of the present invention, although the substrate is generally of disk shape having a thickness of about 0.5 to 3 mm and a diameter of about 50 to 360 mm. If required, the substrate may be provided on its surface with a grooved or other shaped pattern for tracking, and addressing purposes.

Dielectric layers

The lower dielectric layer 3 is provided to prevent oxidation of the recording layer, and protect the substrate by cutting off heat that may otherwise be conducted from the recording layer to the substrate during recording. The upper dielectric layer 5 is provided to protect the recording layer, and escape the heat remaining in the recording layer by heat conduction after the completion of recording. Both the dielectric layers also contribute to an improved degree of modulation.

In accordance with the present invention, at least one of the upper and lower dielectric layers contains zinc sulfide. In the present disclosure, the zinc sulfide-containing dielectric layer will hereinafter be referred to as the ZnS-containing dielectric layer. In the practice of the present invention, the ZnS-containing dielectric layer further contains metal element A that has a standard free energy for the formation of a sulfide thereof lower than a standard free energy for the formation of ZnS at 0 to 1,000° C. By incorporating metal element A in the ZnS-containing dielectric layer, it is possible to prevent sulfur isolation upon repeated overwriting, thereby preventing jitter increases.

In the practice of the present invention, it is preferable to use at least one element selected from the group consisting of cerium or Ce, calcium or Ca, magnesium or Mg, strontium or Sr, barium or Ba, and sodium or Na, with Ce being most preferable because of its low standard free energy for the formation of its sulfide. At 300° K, for instance, the standard free energy is ca. −230 kJ/mol for the formation of ZnS, ca. −540 kJ/mol for the formation of CeS, ca. −510 kJ/mol for the formation of CaS, ca. −390 kJ/mol for the formation of MgS, ca. −500 kJ/mol for the formation of SrS, ca. −460 kJ/mol for the formation of BaS, and ca. −400 kJ/mol for the formation of $Na_2S$.

In the ZnS-containing dielectric layer, the ratio of metal element A to all metal elements is less than 2 at %, preferably up to 1.5 at %, and more preferably up to 1.3 at %. Too much metal element A is substantially ineffective for prevention of jitter increases upon repeated overwriting. To take full advantage of the present invention, it is preferred that the proportion of metal element A is particularly at least 0.01 at %, and more particularly at least 0.03 at %. The ratio of metal element A to all metal elements may be determined by fluorescent X-ray analysis, EPMA (electron probe X-ray microanalysis), or the like. In the present disclosure, all metals in the dielectric layer are understood to include metalloids such as silicon or Si.

In the dielectric layer, metal element A may be present in the form of any of a single substance, sulfide, oxide, fluoride, etc.

Preferably, the ZnS-containing dielectric layer contains, in addition to zinc sulfide, for instance, oxides, nitrides, and fluorides. Such compounds, for instance, include silicon oxides ($SiO_2$, SiO), tantalum oxide ($Ta_2O_5$), titanium oxide ($TiO_2$), lanthanum oxide ($La_2O_3$), silicon nitride ($Si_3N_4$), aluminum nitride (AlN), magnesium fluoride ($MgF_2$), sodium fluoride (NaF), and thorium fluoride ($ThF_4$), at least one of which is preferably used in the practice of the present invention. A dielectric layer, when substantially formed of zinc sulfide alone, becomes too hard, and so suffers from delamination due to thermal shocks produced upon repeated overwriting, resulting in a robustness drop. By incorporating silicon oxide or nitride in the dielectric layer, however, it is possible to achieve an improvement in robustness upon overwriting.

The zinc sulfide content of the ZnS-containing dielectric layer is preferably 50 to 95 mol %, and more preferably 70 to 90 mol %. Too little ZnS makes the thermal conductivity of the dielectric layer too high and the refractive index thereof too low to achieve high C/N. Too much, on the other hand, detracts from robustness upon overwriting. The ZnS content of the dielectric layer may be determined on the basis of the quantity of sulfur and the quantity of zinc found by fluorescent X-ray analysis or the like. When, for instance, zinc is in excess of sulfur, excessive zinc is supposed to exist in the form of other compound, e.g., ZnO.

While an account has been given of a specific arrangement wherein the ZnS-containing dielectric layer contains metal element A, it is understood that an intermediate layer containing metal element A may be interleaved between the ZnS-containing dielectric layer and the recording layer. Such an intermediate layer, for instance, may be made up of cerium oxide ($CeO_2$) alone or a ZnS—$CeO_2$ mixture.

When only one of the upper and lower dielectric layers is used in the form of the ZnS-containing dielectric layer, the other or ZnS-free dielectric layer may be made up of any desired material, for instance, various dielectric materials other than ZnS or a mixture thereof, transparent ceramic materials, and various glass materials. To this end use may also be made of so-called LaSiON materials containing lanthanum, silicon, oxygen and nitrogen, so-called SiAlON materials containing silicon, aluminum, oxygen and nitrogen, SiAlON materials further containing yttrium or Y, etc.

Preferably, the lower and upper dielectric layers have a refractive index of at least 1.4, and especially at least 1.8 in the wavelength range of 400 to 850 nm. In this regard, the aforesaid wavelength range includes a wavelength 780 nm at which state-of-the-art CD players are used, and wavelengths 630–680 nm which are a candidate for the next-generation wavelengths now under development. The optical recording media of the present invention are preferably used in such a wavelength range.

The lower dielectric layer 3 has a thickness of preferably 500 to 3,000 Å, and more preferably 1,000 to 2,500 Å. By allowing the lower dielectric layer 3 to have such a thickness, it is possible to ensure effective prevention of damage to the substrate upon recording, and to increase the degree of modulation as well. The upper dielectric layer 5 has a thickness of preferably 100 to 300 Å, and more preferably 130 to 200 Å. By allowing the upper dielectric layer 5 to have such a thickness, it is possible to ensure a fast cooling rate, and hence to clearly delimit the edges of recorded marks, resulting in reduced jitters. Such a thickness also results in an increased degree of modulation.

Each dielectric layer is preferably formed by vapor deposition processes such as sputtering, and evaporation. The incorporation of metal element A in the dielectric layer may be achieved by various processes. When, for instance, cerium is used as metal element A, the target used may comprise a major target providing a major component of the dielectric layer, on which a chip composed of cerium alone or $CeO_2$ is placed. Alternatively, $CeO_2$ or other cerium compound may be incorporated in the major target. In another target embodiment wherein calcium or magnesium is used as metal element A, a chip composed of CaO or MgO may be placed on the aforesaid major target to form a target. However, this embodiment is not preferable because of the deliquescence of such compounds. Preferably in this case, therefore, a chip composed of $CaF_2$ or $MgF_2$ is placed on the major target to form a target. When strontium, barium or sodium is used as metal element A, too, it is preferable to use a fluoride chip rather than an oxide chip in view of deliquescence. Calcium, magnesium, strontium, barium, and sodium may be incorporated in the major target in the form of an oxide or other compound. It is noted that a composite target such as ZnS-$SiO_2$ may be used for the major target, or use may be made of a multi-target process wherein ZnS, and $SiO_2$ are independently used as the major target.

The ZnS-containing dielectric layer may be formed by ordinary sputtering processes in an argon atmosphere, but it is preferable to carry out sputtering in an Ar/$O_2$ mixed atmosphere. By performing sputtering in such a mixed atmosphere, it is possible to enhance the effect on reducing a jitter increase upon repeated overwriting. The introduction of $O_2$ at the time of sputtering is particularly effective for carrying out sputtering while a chip composed of metal element A alone is placed on the major target. This is also effective for the cases where a chip composed of a compound of metal element A is placed on the major target, and a compound of metal element A is incorporated in the major target. When the amount of $O_2$ incorporated in the sputtering atmosphere is represented by a partial pressure ratio $O_2/(Ar+O_2)$, it is preferable that the partial pressure ratio is particularly up to 30%, and more particularly up to 25%. The incorporation of too much $O_2$ is not preferable although it is possible to lower recording power. This is because the margin of erasing power becomes extremely narrow due to the erasing power remaining unchanged. It is here noted that in order to take full advantage of the incorporation of $O_2$, the aforesaid partial pressure ratio is preferably at least 5%, and more preferably at least 10%.

Recording Layer

Insofar as the phase change type optical recording medium is concerned, the advantages of the present invention are achievable irrespective of the composition of the recording layer, provided however that the dielectric layer can be heated to such a high temperature as to isolate sulfur therefrom at the time of recording. Thus, the composition of the recording layer is not critical to the practice of the present invention. However, it is understood that the present invention is very effective for optical recording media having recording layers based on In—Ag—Te—Sb and Ge—Sb—Te compositions, especially In—Ag—Te—Sb compositions.

In the present invention, the atomic ratio of elements constituting a recording layer based on the In—Ag—Te—Sb composition is given by formula I:

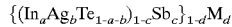

$$\{(In_a Ag_b Te_{1-a-b})_{1-c} Sb_c\}_{1-d} M_d$$

Preferably, the letters a, b, c and d fall in the ranges:

a=0.1 to 0.3
b=0.1 to 0.3
c=0.5 to 0.8
d=0 to 0.05

More preferably, the letters a, b, c and d fall in the ranges:

a=0.11 to 0.28
b=0.15 to 0.28
c=0.55 to 0.65
d=0.005 to 0.05

When the value of a in formula I is too small, the indium or In content of the recording layer becomes relatively too small. This in turn recorded marks become less amorphous, resulting in a drop of the degree of modulation, and a reliability drop as well. At too large a value of a, on the other hand, the In content of the recording layer becomes relatively too high. This in turn makes the reflectance of regions other than the recorded marks low, resulting in a drop of the degree of modulation.

When the value of b in formula I is too small, the silver or Ag content of the recording layer becomes relatively too low. This in turn makes the recrystallization of recorded marks difficult and so renders repeated overwriting difficult. At too large a value of b, on the other hand, the Ag content of the recording layer becomes relatively high, and so excessive Ag diffuses independently into an Sb phase at the time of recording or erasing. This in turn makes the robustness of the recording layer upon rewriting low, and renders the stability of both recorded marks and crystalline portions low, resulting a reliability drop. In other words, the crystallization of the recorded marks is promoted during storage at high temperatures, often resulting in drops of C/N and degree of modulation. Repetition of recording may often facilitate deterioration of C/N and degree of modulation.

When the value of a+b is too small, a tellurium or Te phase is formed by excessive Te. The Te phase makes erasing difficult because it slows down the rate of crystal transition. When the value of a +b is too large, on the other hand, it is difficult to make the recording layer amorphous, leading to a possibility that signals may not be recorded.

When the value of c in formula I is too small, there is an increased reflectance difference concomitant with a phase change, but difficulty is involved in erasing because of an abrupt crystal transition rate drop. At too large a value of c, on the other hand, there is a decreased degree of modulation due to a decreased reflectance difference incidental to the phase change.

In formula I, M represents at least one element selected from the group consisting of H, Si, C, V, W, Ta, Zn, Ti, Ce, Tb and Y. The element M is effective for improving rewriting robustness, more specifically reducing the drop of the rate of erasure due to repeated rewriting, and contributes to a reliability improvement under unfavorable conditions, e.g., high temperature and humidity conditions. Of these elements, it is preferable to use at least one of V, Ta, Ce and Y because their such effects are strong. Particular preference is given to at least one of V and Ta, with V being most preferred.

When the value of d representing the content of the element M is too large, no sufficient degree of modulation is obtainable because of a decreased reflectance difference concomitant with a phase change. When the value of d is too small, the effect of the element M added becomes slender.

It is preferred that the recording layer based on this composition consists essentially of Ag, Sb, Te and In, and the element or elements M added if required. In the practice of the present invention, however, it is acceptable that the silver may be partially replaced by gold or Au, the antimony may be partially replaced by bismuth or Bi, the tellurium may be partially replaced by selenium or Se, and the indium may be partially replaced by aluminum or Al and/or phosphorus or P.

The percent replacement of Ag by Au is preferably up to 50 at %, and more preferably up to 20 at %. At too high a percent replacement, recorded marks are susceptible to crystallization, leading to a reliability drop at high temperatures.

The percent replacement of Sb by Bi is preferably up to 50 at %, and more preferably up to 20 at %. Too high a percent replacement causes the recording layer to have an increased coefficient of absorption, resulting in a reduction of the interference effect of light. This in turn makes the reflectance difference between crystalline and amorphous portions and hence the degree of modulation low, so failing to obtain high C/N.

The percent replacement of Te by Se is preferably up to 50 at %, and more particularly up to 20 at %. Too high a percent replacement causes the rate of crystal transition to become too low to obtain any sufficient rate of erasure.

The percent replacement of In by Al and/or P is preferably up to 40 at %, and more preferably up to 20 at %. Too high a percent replacement causes the stability of recorded marks to become low with a reliability drop. It is noted that Al and P may be used at any desired proportion.

It is noted that, after repeated rewriting, the recording layer based on this composition has a coefficient of absorption k of about 3.3 in a crystalline state, and about 2.2 in a micro-crystalline or amorphous state.

The recording layer based on the aforesaid composition has a thickness of preferably 95 to 500 Å, and more preferably 130 to 300 Å. Too thin a recording layer makes the growth of a crystalline phase difficult, and so renders a reflectance change incidental to a phase change insufficient. Too thick a recording layer, on the other hand, causes a large amount of silver to diffuse in the recording layer in a thickness direction thereof during the formation of recorded marks. This in turn makes the proportion of silver diffusing in a longitudinal direction of the recording layer low, resulting in a drop of the reliability of the recording layer. Too thick a recording layer gives rise to drops of both reflectance and degree of modulation.

The atomic ratio of elements constituting a recording layer based on the Ge—Sb—Te composition is given by formula $$Ge_aSb_bTe_{1-a-b}$$

Preferably, the letters a and b fall in the ranges:
0.08<a<0.25
0.20<b<0.40

When the value of a in formula II is too small, recorded marks are difficult to crystallize, resulting in a decrease in the rate of erasure. At too large a value of a, on the other hand, much tellurium binds to germanium. The resulting precipitation of antimony in turn makes it difficult to form recorded marks.

When the value of b in formula II is too small, recorded marks are susceptible to crystallization during storage at high temperatures due to the presence of much tellurium, resulting in a reliability drop. When the value of b is too large, it is difficult to form recorded marks due to the precipitation of antimony.

The recording layer based on the aforesaid composition has a thickness of preferably 140 to 500 Å. Too thin a recording layer makes the growth of a crystalline phase difficult, and so renders a reflectance change incidental to a phase change insufficient. Too thick a recording layer, on the other hand, gives rise to drops of both reflectance and degree of modulation.

The composition of the recording layer may be determined by EPMA, X-ray microanalysis, ICP, or the like.

Preferably, the recording layer is formed by sputtering. Sputtering conditions are not critical to the practice of the present invention. For instance, an alloy target or a multi-sputtering process with a plurality of targets may be used for the sputtering of a material comprising a plurality of elements.

Reflective layer

The reflective layer 6 may be formed of any desired material, usually any of high-reflectance metals or alloys of such metals, for instance, Al, Au, Ag, Pt, and Cu, and has preferably a thickness of 300 to 2,000 Å. At a thickness less than the lower limit of this range, it is difficult to obtain any sufficient reflectance. A thickness exceeding the upper limit of the range provides no further improvement in reflectance, and is rather unfavorable in view of cost-effectiveness. Preferably, the reflective layer 6 is formed by vapor deposition processes such as sputtering or evaporation.

Protective layer

The protective layer 7 is provided to improve scratch resistance and corrosion resistance. Preferably, this protective layer is formed of various organic materials. However, particular preference is given to constructing the protective layer of a radiation-curable type compound or a composition thereof, which is cured with radiation such as electron beams or ultraviolet rays. The protective layer 7 has usually a thickness of about 0.1 to 100 μm, and may be formed by ordinary processes such as spin coating, gravure coating, spray coating, and dipping.

Rewriting or overwriting

For rewriting, the optical recording medium of the present invention may be irradiated with laser beam as is the case with the aforesaid conventional phase change type optical recording medium. A pulse form of recording power may be applied on the optical recording medium. If one signal is recorded by at least two exposures to laser beam, the accumulation of heat in recorded marks can then be so reduced that the dilation of the trailing edges of the recorded marks (teardrop phenomena) can be avoided, resulting in an improved C/N. A pulse form of irradiation of the optical recording medium with laser beam also contributes to an improvement in the rate of erasure. Actual values of recording power and erasing power may be experimentally determined. It is understood that the reading laser beam used should be of such low power that the crystallographic state of the recording layer can remain substantially unaffected.

For recording, the linear velocity of the recording layer of the optical recording medium according to the present invention is usually about 0.8 to 20 m/s, and preferably 1.2 to 16 m/s with respect to laser beam.

Insofar as the optical recording medium of the present invention is concerned, the light used for rewriting or reading may be freely selected from a wide wavelength region, for instance, from the range of 100 to 5,000 nm.

EXAMPLE

The present invention will now be explained more specifically with reference to some examples thereof.

Example 1

Lower dielectric layer 3, recording layer 4, upper dielectric layer 5, reflective layer 6 and protective layer 7 were formed on a surface of a disk form of polycarbonate substrate 2 of 130 mm in diameter and 0.6 mm in thickness. A groove was formed in one major surface of the substrate simultaneous with injection molding. In this way, an optical recording disk sample having such an architecture as shown in FIG. 1 was prepared. The grooves had a width of 0.74 μm, a depth of 650 Å, and a pitch of 1.48 μm.

Lower dielectric layer 3 was formed by sputtering. First, an argon gas was introduced into a vacuum chamber evacuated to $1 \times 10^{-2}$ Pa or lower to regulate its internal pressure to about 0.1 Pa. Then, sputtering was carried out using a target comprising a major target having a diameter of 90 mm and a ZnS (80 mol %)-SiO$_2$ (20 mol %) composition, and three cerium chips, each 5 mm square, placed thereon. By fluorescent X-ray analysis, the ratio of cerium to all metal elements in the lower dielectric layer was found to be 1.2 at %. The lower dielectric layer had a thickness of 2,250 Å.

Recording layer 4 was formed by sputtering, using a target having a composition, in atomic ratio, of $$In_6Ag_7Te_{28}Sb_{58}V_1$$

It is understood that this composition corresponds to formula $\{(In_aAg_bTe_{1-a-b})_{1-c}Sb_c\}_{1-d}M_d$ where a=0.16, b=0.17, c=0.58, and d=0.01. The recording layer had a thickness of 170 Å.

Upper dielectric layer 5 was formed as in the case of lower dielectric layer 3, with the proviso that sputtering was done in an Ar+O$_2$ mixed atmosphere where O$_2$/(Ar+O$_2$) was 20%. By fluorescent X-ray analysis, the ratio of cerium to all metal elements in dielectric layer 5 was found to be 0.2 at %. Upper dielectric layer 5 had a thickness of 150 Å.

Reflective layer 6 was formed by sputtering using a target composed mainly of aluminum. The reflective layer had a thickness of 1,500 Å.

Protective layer 7 was formed by spin coating an ultraviolet-curable resin on layer 6, and irradiating the resin with ultraviolet rays for curing. The protective layer had a post-curing thickness of 5 μm.

Figure 2:
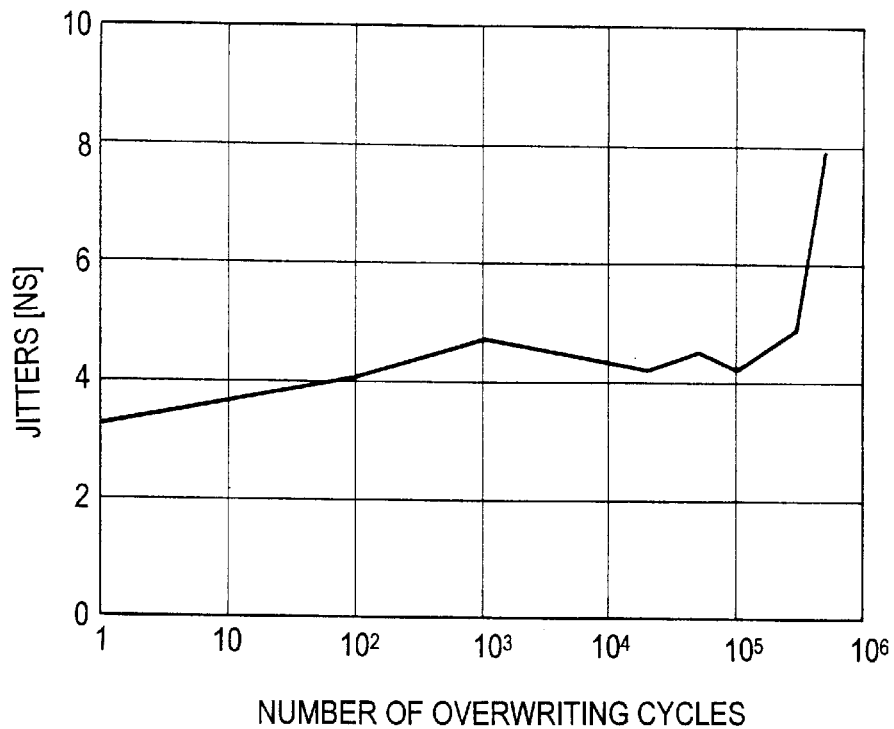
FIG. 2 is a graph showing the number of overwriting cycles vs. quantity of jitters relation in one optical recording medium according to the present invention.

While this sample set on an optical recording medium estimator was rotated at a linear speed of 6 m/s, an overwriting cycle for recording 8–16 RLL signals with a recording power of 12.0 mW and an erasing power of 5.0 mW were repeated. The relation between the number of overwriting cycles and the quantity of corresponding jitters is shown in FIG. 2. From FIG. 2, it is understood that insofar as this sample is concerned, the quantity of jitters makes an almost flat shift until 300,000 overwriting cycles.

Example 2

An optical recording medium sample was prepared following Example 1 except that eight cerium chips were used for the formation of lower and upper dielectric layers 3 and 5. The ratio of cerium to all metal elements in lower dielectric layer 3 of this sample was 1.8 at %, and the ratio of cerium to all metal elements in upper dielectric layer 5 was 0.4 at %. As a result of similar estimation of this sample as in Example 1, it was noted that the quantity of jitters makes an almost flat shift until 50,000 overwriting cycles.

Example 3

An optical recording medium sample was prepared following Example 1 except that when upper dielectric layer 5 was formed, no $O_2$ was introduced in the sputtering atmosphere. The ratio of cerium to all metal elements in upper dielectric layer 5 of this sample was 1.2 at % as in lower dielectric layer 3. As a result of similar estimation of this sample as in Example 1, it was noted that the quantity of jitters makes an almost flat shift until 10,000 overwriting cycles.

Comparative Example

Figure 3:
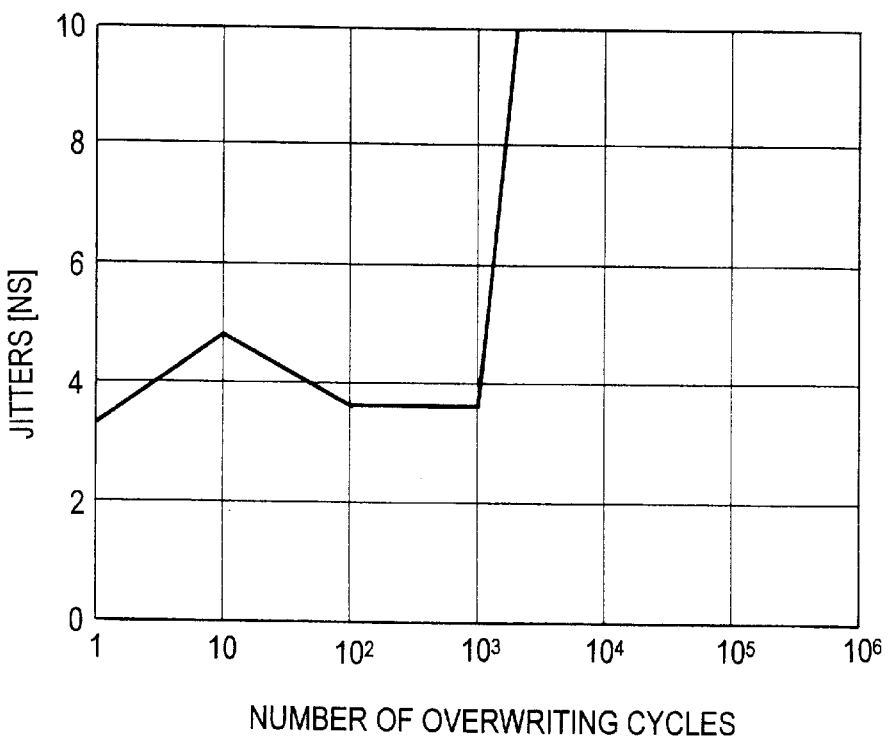
FIG. 3 is a graph showing the number of overwriting cycles vs. quantity of jitters relation in one conventional optical recording medium.

An optical recording medium sample was prepared following Example 3 with the exception that when lower and upper dielectric layers 3 and 5 were formed, no cerium chips were placed on the major target. The overwriting characteristics of this sample were measured following Example 1 with the exception that a recording power of 10.0 mW was used. The results are shown in FIG. 3. From FIG. 3, it is found that this sample suffers from an sharply increased jitter after the number of overwriting cycles exceeds 1,000.

After the completion of 300 overwriting cycles, the reflective layer was removed from the sample. Then, only recording layer 4 was obtained by dissolving the polycarbonate substrate in chloroform, and removing lower and upper dielectric layers 3 and 5 by etching with hydrofluoric acid. By observation of recording layer 4 under a transmission electron microscope annexed to an energy-dispersion X-ray spectroscopy (EDS), it was found that a sulfur-enriched layer is attached to an overwriting area of the recording layer. This layer appears to be a diffusion layer formed by the diffusion of free sulfur from within the dielectric layer into the recording layer. By EDS determination of the composition of the overwriting area of the recording layer inclusive of such a diffusion layer, it was confirmed that the Zn content is 10 at % and the S content is 20 at %, and so the composition of the recording layer is affected by the diffusion of sulfur.

The aforesaid examples and comparative example indicate that by the incorporation in the dielectric layer of an element having a standard free energy for the formation of a sulfide thereof lower than a standard free energy for the formation of ZnS, it is possible to prevent an isolation or segregation of sulfur from the dielectric layers or the inclusion of sulfur in the recording layer, which may otherwise be caused by the application of heat resulting from the irradiation of the recording medium with laser beam. Consequently, it is found that it is possible to prevent an increased jitter upon repeated overwriting and, hence, increase the number of overwriting cycles considerably.

Even when a chip of $CaF_2$, $MgF_2$, $SrF_2$, $BaF_2$, and NaF was placed on the major instead of a cerium chip to form dielectric layers, some improvements in overwriting characteristics were observed as in the aforesaid examples. Even when at least a portion of $SiO_2$ in the dielectric layer was replaced by at least one compound of $Ta_2O_5$, $TiO2$, $La_2O_3$, $Si_3N_4$, AlN, $MgF_2$, NaF and $ThF_4$, it was observed that the effect of metal element A added is similarly available.

Japanese Patent Application No. 358415/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

What we claims is:

1. An optical recording medium comprising a phase change type recording layer on a substrate, said recording layer having a lower dielectric layer in contact with a lower side thereof and an upper dielectric layer in contact with an upper side thereof, and at least one of said upper and lower dielectric layers containing zinc sulfide, and further including a metal element A that has a standard free energy for forming a sulfide thereof lower than a standard free energy for forming zinc sulfide at 0 to 1,000° C., provided that a ratio of said metal element A to all metal elements in said zinc sulfide-containing dielectric layer is less than 2 at %.

2. The optical recording medium of claim 1, wherein said metal element A is at least one element selected from the group consisting of cerium, calcium, magnesium, strontium, barium, and sodium.

3. The optical recording medium of claim 1, wherein said zinc sulfide-containing dielectric layer further contains at least one compound selected from the group consisting of silicon oxide, tantalum oxide, titanium oxide, lanthanum oxide, silicon nitride, aluminum nitride, magnesium fluoride, sodium fluoride, and thorium fluoride.

4. The optical recording medium of claim 1, wherein said zinc sulfide-containing dielectric layer has a zinc sulfide content of 50 to 95 mol %.

5. The optical recording medium of claim 1, wherein the ratio of said metal element A to all metal elements in said zinc sulfide-containing dielectric layer is 0.01 to 1.5 at %.

6. A method of fabricating an optical recording medium as defined in claim 1, wherein said zinc sulfide-containing dielectric layer is formed by sputtering in an atmosphere comprising a mixture of argon and oxygen.

* * * * *